US009472502B1

(12) United States Patent
Lee et al.

(10) Patent No.: US 9,472,502 B1
(45) Date of Patent: Oct. 18, 2016

(54) COBALT INTERCONNECT TECHNIQUES

(71) Applicant: Taiwan Semiconductor Manufacturing Co., Ltd., Hsin-Chu (TW)

(72) Inventors: Ya-Ling Lee, Hsinchu (TW); Wen-Cheng Yang, Hsinchu (TW); Victor Y. Lu, Foster City, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/798,996

(22) Filed: Jul. 14, 2015

(51) Int. Cl.
*H01L 23/532* (2006.01)
*H01L 21/768* (2006.01)
*H01L 23/522* (2006.01)
*H01L 23/528* (2006.01)

(52) U.S. Cl.
CPC ... *H01L 23/53209* (2013.01); *H01L 21/76843* (2013.01); *H01L 21/76867* (2013.01); *H01L 21/76873* (2013.01); *H01L 21/76879* (2013.01); *H01L 21/76883* (2013.01); *H01L 23/528* (2013.01); *H01L 23/5226* (2013.01)

(58) Field of Classification Search
CPC .............. H01L 21/76843; H01L 21/76867; H01L 21/76873; H01L 21/76879; H01L 21/76883; H01L 23/5226; H01L 23/528; H01L 23/53209
See application file for complete search history.

(56) References Cited

U.S. PATENT DOCUMENTS

| 6,436,819 | B1 | 8/2002 | Zhang et al. | |
|---|---|---|---|---|
| 6,521,956 | B1* | 2/2003 | Lee | H01L 21/28525 257/382 |
| 7,846,841 | B2 | 12/2010 | Ishizaka et al. | |
| 8,110,489 | B2 | 2/2012 | Ganguli et al. | |
| 2002/0019127 | A1* | 2/2002 | Givens | H01L 21/28518 438/637 |
| 2007/0111519 | A1* | 5/2007 | Lubomirsky | C23C 18/1653 438/678 |
| 2007/0269974 | A1* | 11/2007 | Park | H01L 21/76848 438/618 |
| 2010/0078818 | A1* | 4/2010 | Ishizaka | H01L 21/76831 257/751 |
| 2010/0081271 | A1* | 4/2010 | Ishizaka | H01L 21/76831 438/622 |
| 2013/0260555 | A1* | 10/2013 | Zope | H01L 21/4846 438/660 |
| 2013/0341794 | A1* | 12/2013 | Yu | C25D 7/123 257/751 |
| 2014/0183738 | A1* | 7/2014 | Jezewski | H01L 23/485 257/751 |
| 2014/0287577 | A1* | 9/2014 | Emesh | H01L 21/76879 438/618 |
| 2014/0374904 | A1* | 12/2014 | Matsumoto | H01L 23/5226 257/741 |
| 2015/0270168 | A1* | 9/2015 | Breil | H01L 21/76883 257/757 |

OTHER PUBLICATIONS

Londergan, et al. "Interlater Mediated Epitaxy of Cobalt Silicide on Silicon (100) From Low Temperature Chemical Vapor Deposition of Cobalt." Journal of the Electrochemical Society, 148 (1) C21-27, (2001).

Bhandari, et al. "Chemical Vapor Deposition of Cobalt Nitride and Its Application as an Adhesion-Enhancing Layer for Advanced Copper Interconnects." ECS Journal of Solid State Science and Technology, 1 (5) N79-N84 (2012). Sep. 5, 2012.

Lee, et al. "Characterization of the Co Filim Deposited by MOVCD Using Dicobalt (Hexacarbonyl) Tert-Butylacetylene and the CoSi2 Film Formed by a Two-Step Annealing Process With a Ti Capping Layer." Journal of Ceramic Processing Research, vol. 13, No. 5, pp. 595-600 (2012).

* cited by examiner

*Primary Examiner* — Allan R Wilson
(74) *Attorney, Agent, or Firm* — Eschweiler & Associates, LLC (57) ABSTRACT

Some embodiments relate to a method of manufacturing an integrated circuit device. In this method a dielectric layer is formed over a substrate. The dielectric layer comprises an opening arranged within the dielectric layer. A first cobalt liner is formed along bottom and sidewall surfaces of the opening. A barrier liner is formed on exposed surfaces of the first cobalt liner. A bulk cobalt layer is formed in the opening and over the barrier liner to fill a remaining space of the opening.

19 Claims, 6 Drawing Sheets

COBALT INTERCONNECT TECHNIQUES

BACKGROUND

In the manufacturing of integrated circuits (ICs), devices are formed on a wafer and connected by conductive interconnect layers. These conductive interconnect layers can be formed during so-called middle-of-the-line (MEOL) processes or back-end-of-line (BEOL) processes. MEOL and BEOL processes are similar in that they both form openings in a dielectric layer (e.g. contact holes, trenches, or via holes in a dielectric layer), and then fill these openings with a conductive material. MEOL differs from BEOL in the MEOL typically occurs earlier in the fabrication process, and may refer to the process of forming contacts to conductive regions such as source/drain drains in the substrate; whereas BEOL typically occurs later in the fabrication process, and may refer to the process of forming successive metallization layers and vias above the contacts formed by MEOL.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In middle-of-the-line (MEOL) interconnect layers, silicidation processes are used to form silicide contacts. Silicidation is commonly implemented in modern semiconductor processes, such as complementary metal oxide semiconductor (CMOS) or bipolar CMOS processes, to form a silicide layer that provides an ohmic contact to a source/drain region, base region, collector region, emitter region, or polysilicon gate, for example. Typically, the first step of forming the silicide layer is forming a metal liner (e.g. titanium liner) in direct contact with an underlying silicon region (e.g., underlying MEOL structure). A barrier liner (e.g. titanium nitride) is then formed on the metal liner by a physical vapor deposition (PVD) process or a chemical vapor deposition (CVD) process in a vacuum chamber. Then, the work piece is removed from the vacuum chamber, and an annealing process is carried out. This annealing process heats the metal liner and the abutting underlying silicon region to form the silicide layer. Then the work piece is sent back to the vacuum chamber, and a conductive plug is formed to fill the remainder of the opening It has been appreciated removing the work piece from the vacuum chamber after forming the metal liner and the barrier liner (i.e., before the subsequent annealing process), has drawbacks. The ambient environment can cause oxidation of the metal liner and/or barrier liner, which can increase the resistance of the resultant interconnect structures. Although this oxidation can be removed by an oxidation reduction process, removal of the oxidation material can lead to the formation of voids. These voids can result in poor electrical connections and can decrease reliability.

Accordingly, the present disclosure relates to an improved method of forming MEOL interconnect layers to reduce contact resistance, reduce voids and improve reliability, and associated devices. In some embodiments, the method comprises forming a metal liner, a barrier liner, and at least a portion of a plug (such as seed layer for plating) in-situ in a vacuum chamber. An annealing process is performed after forming the portion of the plug to cause the metal liner to mix with the underlying silicon region, thereby forming a silicide layer. By keeping the metal liner and the barrier liner under a continuous vacuum (e.g., not exposing the metal liner and barrier liner to the ambient environment of the fab), oxidation is limited and voids are reduced. In some embodiments, the metal liner and the plug material are made of cobalt, and the barrier liner is made of cobalt nitride. Since cobalt and cobalt nitride can be formed at room temperature or relatively low temperatures, condensation be limited and performance of the device is further improved.

Figure 1A:
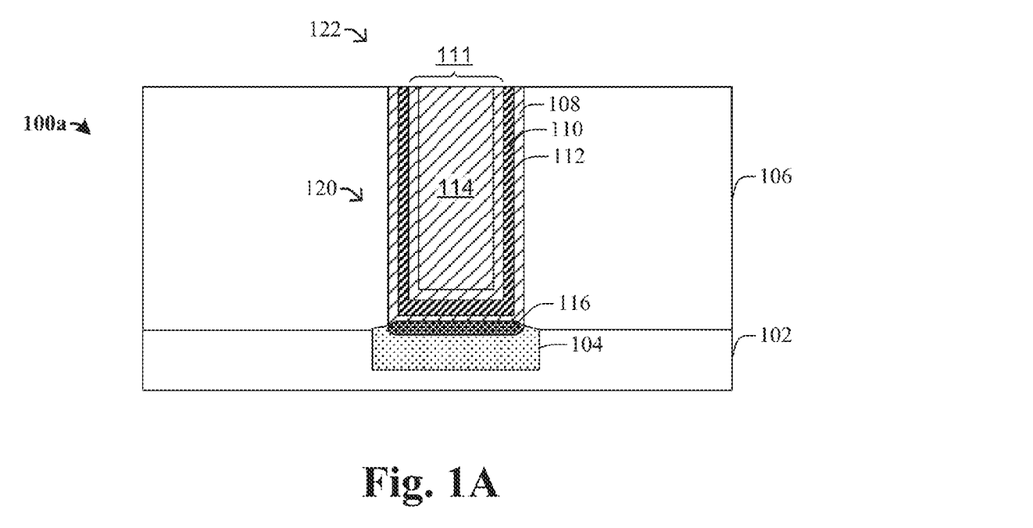
FIG. 1A shows a cross-sectional view of an integrated circuit having an interconnect structure in accordance with some embodiments.

FIG. 1A shows a cross-sectional view of an integrated circuit 100a in accordance with some embodiments.

In some embodiments, the integrated circuit 100a comprises a dielectric layer 106 disposed over a substrate 102. A conductive interconnect structure 120 is disposed within an opening 122 vertically extending through the dielectric layer 106. The conductive interconnect structure 120 comprises a first cobalt liner 108, a barrier liner 110, and a cobalt plug 111 disposed in that order from periphery to center of the opening 122. A silicide film 116 is disposed at an interface of the first cobalt line 108 and a semiconductor structure 104, such as a silicon region in substrate 102. The silicide film 116 comprises a compound of silicon atoms and cobalt atoms, providing lattice matching and good contact (e.g., ohmic contact) between the semiconductor structure 104 and the conductive interconnect structure 120 thereon.

The first cobalt liner 108 is disposed along bottom and sidewall surfaces of the opening 122. In some embodiments, the first cobalt liner 108 is in direct contact with the dielectric layer 106. In some embodiments, the first cobalt liner 108 is cobalt or a compound containing cobalt. The first cobalt liner 108 can have a thickness of from about 20 Å to about 30 Å. In some other embodiments, the first cobalt liner 108 can have a thickness of from about 10 Å to about 50 Å. In some further embodiments, the first cobalt liner 108 can have a thickness of from about 10 Å to about 200 Å.

The barrier liner 110, for example, a cobalt nitride (CoN) liner, is disposed on the first cobalt liner 108 and covers bottom and sidewall surfaces of the first cobalt liner 108. The barrier liner 110 is configured as a silicide formation limiting material to prevent silicide material from diffusing though the barrier liner 110. In some embodiments, the barrier liner 110 can have a thickness of from about 10 Å to about 20 Å. In some other embodiments, the barrier liner 110 can have a thickness of from about 10 Å to about 30 Å. In some further embodiments, the barrier liner 110 can have a thickness of from about 10 Å to about 100 Å.

The cobalt plug 111 can include multiple distinct layers, such as a cobalt seed liner 112 and a bulk cobalt layer 114, which fill a remaining space of the opening 122. In some embodiments, the cobalt seed liner 112 is cobalt or a compound containing cobalt. In some embodiments, the cobalt seed liner 112 can have a thickness of from about 20 Å to about 50 Å. In some other embodiments, the cobalt seed liner 112 can have a thickness of from about 20 Å to about 300 Å. In some embodiments, the bulk cobalt layer 114 can have a thickness of from about 200 nm to about 600 nm. In some other embodiments, the cobalt plug 111 can be a continuous conductive body of uniform material which is made by a single deposition process, especially when an aspect ratio of the opening 122 is very small; and in such cases the bulk cobalt layer 114 can be observed in direct contact with the barrier liner 110.

The semiconductor structure 104 is disposed within the substrate 102 directly under the opening 122. In some embodiments, the semiconductor structure 104 is a middle-of-the-line (MEOL) structure. In some embodiments, the middle-of-the-line (MEOL) structure can be an active region of a semiconductor device comprising a doped semiconductor structure, such as a source/drain region or polysilicon gate of a field effect transistor. As an example, the middle-of-the-line (MEOL) structure can be an epitaxially grown SiGe or SiP region, which acts as source/drain regions and which extends above an upper surface of the substrate 102. In other embodiments, the MEOL structure can be a source/drain region that is formed by ion implantation or out-diffusion, and has an uppermost region corresponding to the upper surface of the substrate 102.

Figure 1B:
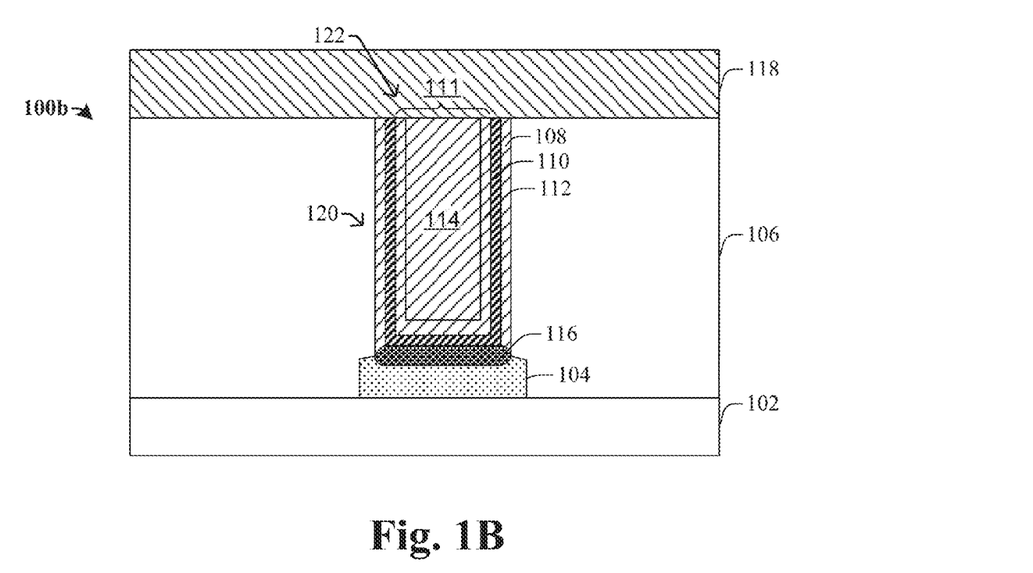
FIG. 1B shows a cross-sectional view of an integrated circuit having an interconnect structure in accordance with some other embodiments.

FIG. 1B shows a cross-sectional view of an integrated circuit 100b in accordance with some embodiments.

In some embodiments, the integrated circuit 100b comprises a semiconductor structure 104 disposed over a substrate 102. As can be appreciated from FIG. 1B, in some embodiments, the upper surface of the semiconductor structure 104 has a concave upper surface and the silicide film 116 extends upwardly to reach a bottom surface of the cobalt nitride liner 510. Thus, whereas FIG. 1A illustrated a first cobalt liner 108 extending over the silicide film 116 to separate the silicide film 116 from the barrier liner 110; FIG. 1B illustrates an example where the silicide film 116 extends upwardly from this concave surface to directly abut a lower surface of the barrier liner 110. The cobalt nitride liner 510 still covers bottom and sidewall surfaces of the cobalt plug 111 and is configured as a silicide formation limiting material to protect the cobalt plug 111 from silicidation. A metal layer 118 can be disposed over the dielectric layer 106 and the conductive interconnection structure 120. In some embodiments, the metal layer 118 can be in direct contact with the conductive interconnect structure 120. The metal layer 118 can be made of same or different materials as the plug material. For example, the metal layer 118 can be made of a compound containing copper or cobalt, or combinations thereof.

Figure 2:
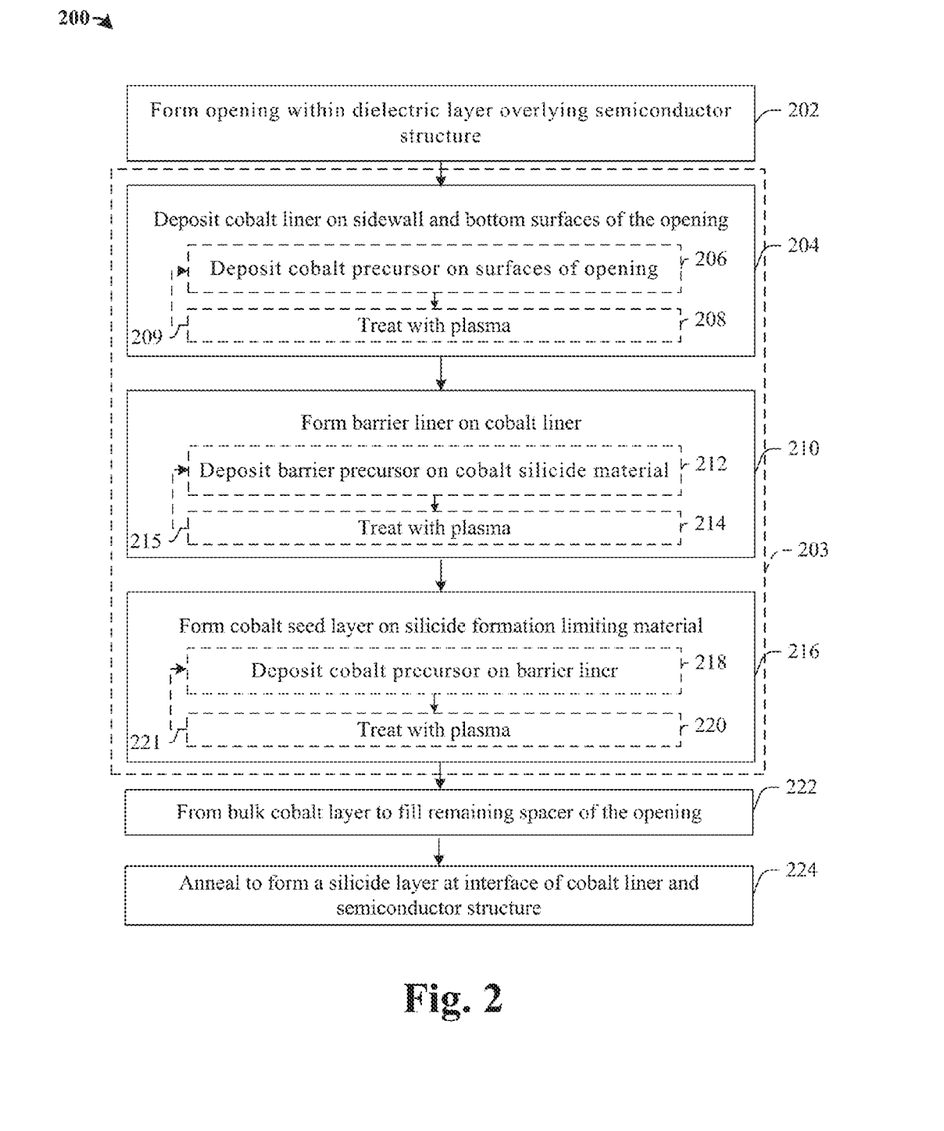
FIG. 2 shows a flow diagram of a method of filling an opening for interconnects in accordance with some embodiments.

FIG. 2 shows some embodiments of a flow diagram of a method 200 of filling an opening for interconnects in accordance with some embodiments. In some embodiments, the method 200 can be applied to a mid-end-of-the-line (MEOL) process to form contact plugs. While disclosed method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At action 202, an opening is formed within a dielectric layer overlying a semiconductor structure. The semiconductor structure can be formed within or over a substrate.

At action 203, as illustrated in detail below, a cobalt liner, a barrier liner, and a cobalt seed layer are formed in-situ to fill the opening respectively at actions 204, 210 and 216. Since the cobalt liner, the barrier liner, and the cobalt seed layer are formed in succession in a chamber under continuous vacuum (e.g., without exposing the semiconductor structure to an ambient fab environment), processing time is significantly decreased. Inadvertent oxidation is also reduced and device quality is improved. In some embodiments, the cobalt liner, the barrier liner, and the cobalt seed layer can be formed using chemical vapor deposition (CVD) processes. In some other embodiments, the cobalt liner, the barrier liner, and the cobalt seed layer can be formed using physical vapor deposition (PVD) processes such as sputtering deposition processes.

At action 204, the cobalt liner is deposited on sidewall and lower surface of the opening, in direct contact with the semiconductor substrate. In some embodiments, the cobalt liner is cobalt or a compound containing cobalt. In some embodiments, the cobalt liner is formed by actions 206, 208 and 209.

At action 206, a cobalt precursor is deposited on surfaces of the opening. In some embodiments, the cobalt precursor may comprise dicobalt hexcarbonyl tertbutylacctylene (CCTBA).

At action 208, the cobalt precursor is treated by plasma. In some embodiments, the treating plasma contains hydrogen.

At action 209, the actions 206 and 208 are repeated to achieve desired thickness of the cobalt liner.

At action 210, the barrier liner is deposited on the cobalt liner, and in direct contact with the cobalt liner. In some embodiments, the barrier liner is a cobalt nitride liner. In some embodiments, the barrier liner is formed by actions 212, 214 and 215.

At action 212, a barrier precursor is deposited on surfaces of the cobalt liner. In some embodiments, the barrier precursor may comprise dicobalt hexcarbonyl tertbutylacctylene (CCTBA) or cobalt tricarbonyl nitrosyl ($Co(CO)_3NO$).

At action 214, the barrier precursor is treated by plasma. In some embodiments, the treating plasma contains hydrogen, nitrogen, or ammonia.

At action 215, the actions 212 and 214 are repeated to achieve desired thickness of the barrier liner.

At action 216, the cobalt seed layer is deposited on the barrier. In some embodiments, the cobalt seed layer is elemental cobalt or a cobalt containing compound. In some embodiments, the cobalt seed layer is formed by actions 218, 220 and 221.

At action 218, a cobalt seed precursor is deposited on surfaces of the barrier liner. In some embodiments, the cobalt seed precursor may comprise dicobalt hexcarbonyl tertbutylacctylene (CCTBA).

At action 220, the cobalt seed precursor is treated by plasma. In some embodiments, the treating plasma contains hydrogen.

At action 221, the actions 218 and 220 are repeated to achieve desired thickness of the cobalt seed layer.

At action 222, a bulk cobalt layer is formed to fill a remaining spacer of the opening. In some embodiments, the bulk cobalt layer is cobalt or a compound containing cobalt. In some embodiments, the bulk cobalt layer is formed by a plating process. In various embodiments, the plating process may comprise an electro-chemical plating process or an electro-less plating process. In some embodiments, a chemical solution used to remove a passivation film formed on the cobalt seed layer is also used as a bath solution for the plating process. In some other embodiments, the bulk cobalt layer is deposited by a PVD process or a CVD process and can be performed in-situ with formation of the cobalt liner and the barrier liner of action 203.

At action 224, an annealing process is performed after filling the remaining space of the opening with the bulk cobalt layer. The annealing process causes the cobalt liner to react with an underlying semiconductor structure to form a silicide film at an interface of the cobalt silicide liner and the underlying semiconductor structure.

FIGS. 3-8 show some cross-sectional views of a method of filling an opening for metal interconnects of an integrated chip according to some embodiments. Although FIGS. 3-8 are described in relation to method 200, it will be appreciated that the structures disclosed in FIGS. 3-8 are not limited to such a method 200, but instead may stand alone as structures independent of the method. Similarly, although the method is described in relation to FIGS. 3-8, it will be appreciated that the method is not limited to the structures disclosed in FIGS. 3-8, but instead may stand alone independent of the structures disclosed in FIGS. 3-8.

Figure 3:
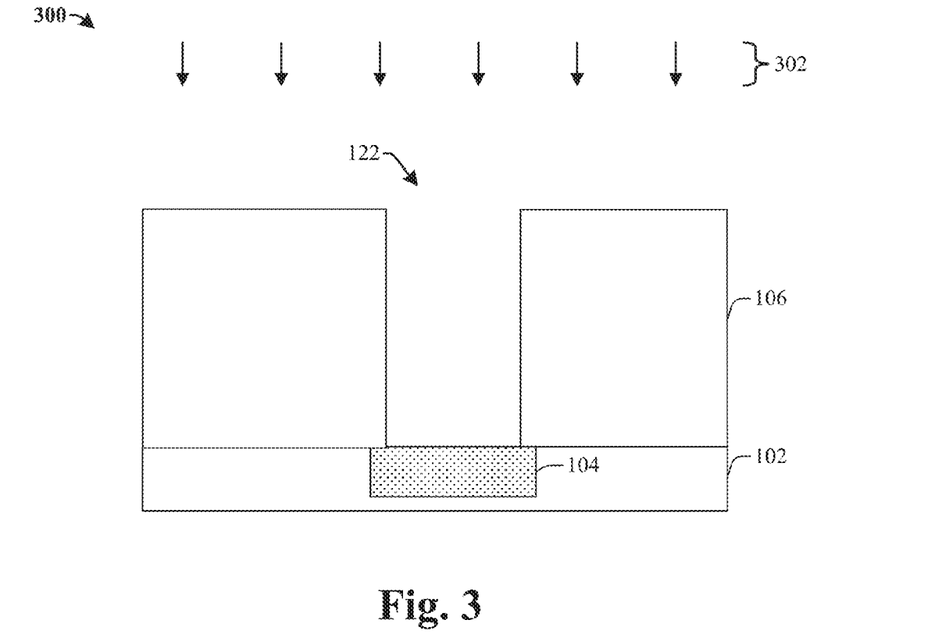
FIGS. 3-8 show cross-sectional views of an integrated circuit illustrating a method of filling an opening for interconnects in accordance with some embodiments.

FIG. 3 illustrates some embodiments of a cross-sectional view 300 corresponding to action 202.

As illustrated by cross-sectional view 300, a semiconductor structure 104 is formed within a substrate 102. In some embodiments, the substrate 102 can be a bulk silicon substrate or a semiconductor-on-insulator (SOI) substrate (e.g. silicon on insulator substrate). The substrate 102 can also be a binary semiconductor substrate (e.g. GaAs), a tertiary semiconductor substrate (e.g. AlGaAs), or a higher order semiconductor substrate, for example. In many instances, during manufacturing the substrate 102 can take the form of a disc-like wafer having a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); or 450 mm (17.7 inch, usually referred to as "18 inch"); for example. In some embodiments, the semiconductor structure 104 can be MEOL structures such as active regions of semiconductor devices. For example, the semiconductor structure 104 can be doped source/drain regions or polysilicon gates of field effect transistors. As an example, the semiconductor structure 104 can be formed through ion implantation, or by forming recesses in the substrate 102 and filling the recesses with a strain-inducing source/drain material (e.g., epitaxially-grown SiP or SiGe). In some embodiments, the semiconductor structure 104 can extend above an upper surface of the substrate 102.

A dielectric layer 106 is formed over the semiconductor structure 104 and the substrate 102. In some embodiments, the dielectric layer 106 can be a silicon dioxide ($SiO_2$) layer having a dielectric constant of approximately 3.9. In other embodiments, the dielectric layer 106 can be a porous or solid low-k dielectric with a dielectric constant of less than 3.9.

An opening 122 is formed within the dielectric layer 106 overlying the semiconductor structure 104. In some embodiments, the opening 122 is formed by subjecting the dielectric layer 106 to an etchant 302 configured to remove unmasked portions of the dielectric layer 106 according to a mask (not shown) previously formed over the dielectric layer 106. In various embodiments, the etchant 302 may comprise a dry etchant have an etching chemistry comprising a fluorine species (e.g., CF4, CHF3, C4F8, etc.). In other embodiments, the etchant 302 may comprise a wet etchant comprising hydroflouric acid (HF). The opening 122 vertically extends through the dielectric layer 106 to the underlying semiconductor structure 104. In some embodiments, the opening 122 may vertically extend through an etch stop layer (not shown) formed between the substrate 102 and the dielectric layer 106. In some embodiments, the opening 122 may comprise trenches or via holes within which conductive interconnect layers are formed. In some embodiments, the opening 122 can be formed by a dual damascene process including forming a trench line overlying a via hole. The dual damascene process can be a trench first process, a via first process, or a self-aligned process. The opening 122 can also be a through substrate via (TSV) opening.

Figure 4:
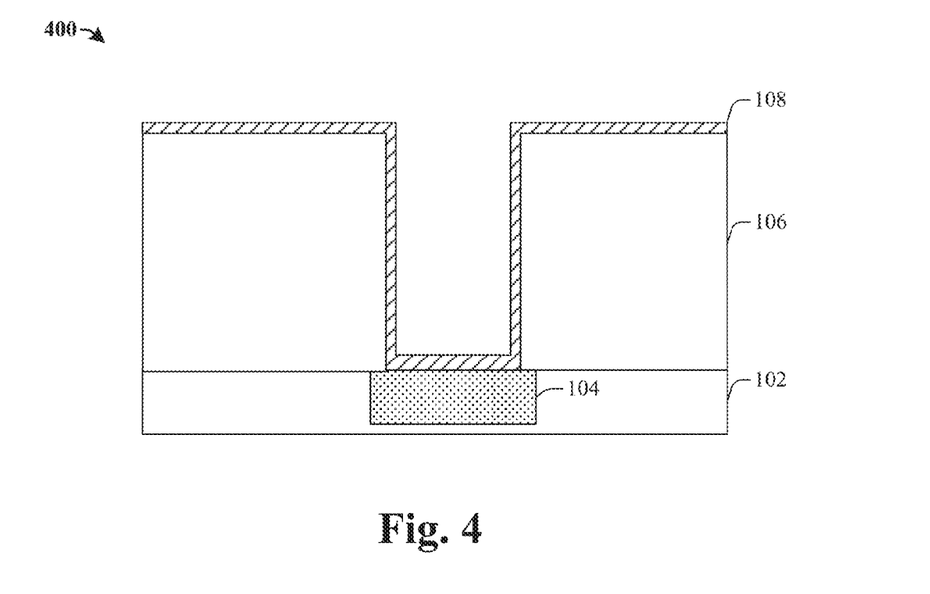

FIG. 4 illustrates some embodiments of a cross-sectional view 400 corresponding to action 204.

As illustrated by cross-sectional view 400, a first cobalt liner 108 is deposited on the sidewalls and lower surface of the opening 122 using a PVD process or a CVD process. It will be appreciated that, as used herein, the term PVD may apply to any type of PVD process, including but not limited to evaporation with subsequent condensation, sputtering or plasma enhanced sputtering; the term CVD may apply to any type of CVD process, including but not limited to plasma-enhanced CVD, remote plasma-enhanced CVD, atomic-layer CVD, rapid thermal CVD, aerosol assisted CVD, etc. In some embodiments, the first cobalt liner 108 extends outward from the opening 122 onto an upper surface of the dielectric layer 106.

Figure 5:
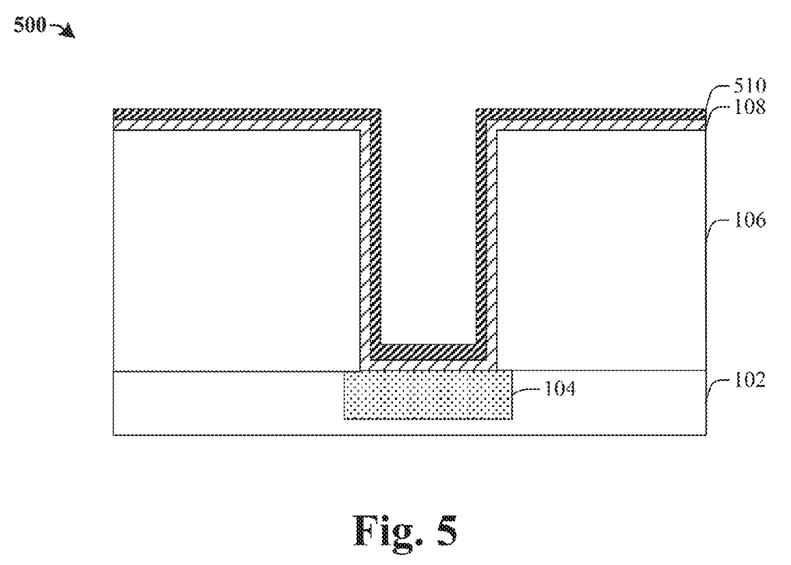

FIG. 5 illustrates some embodiments of a cross-sectional view 500 corresponding to action 210.

As illustrated by cross-sectional view 500, a cobalt nitride liner 510 is formed on the first cobalt liner 108. The cobalt nitride liner 510 acts as a barrier liner. The cobalt nitride liner 510 can be formed using a CVD process. The cobalt nitride liner can be formed at a relatively low temperature (below about 200° C.). After the barrier liner 110 is formed, the work piece is kept in a vacuum chamber for subsequent deposition.

Figure 6:
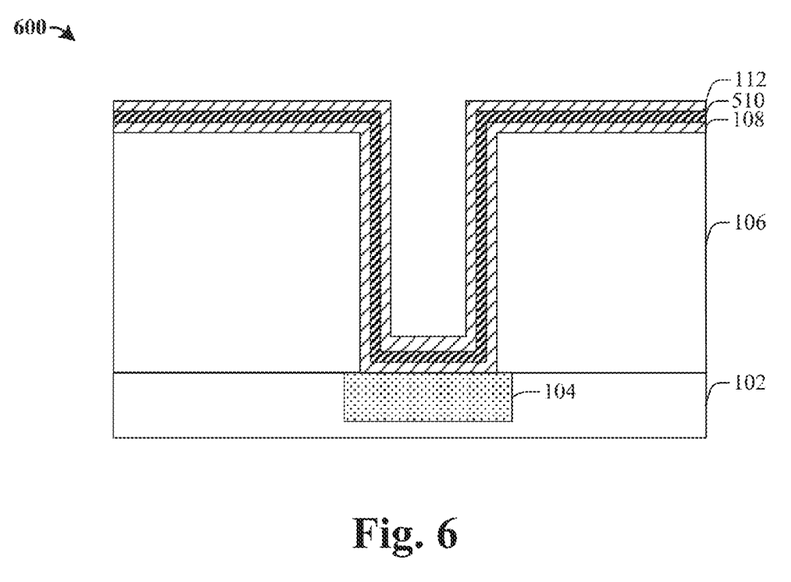

FIG. 6 illustrates some embodiments of a cross-sectional view 600 corresponding to action 216.

As illustrated by cross-sectional view 600, a cobalt seed liner 112 is formed on the cobalt nitride liner 510 using a CVD process.

Figure 7:
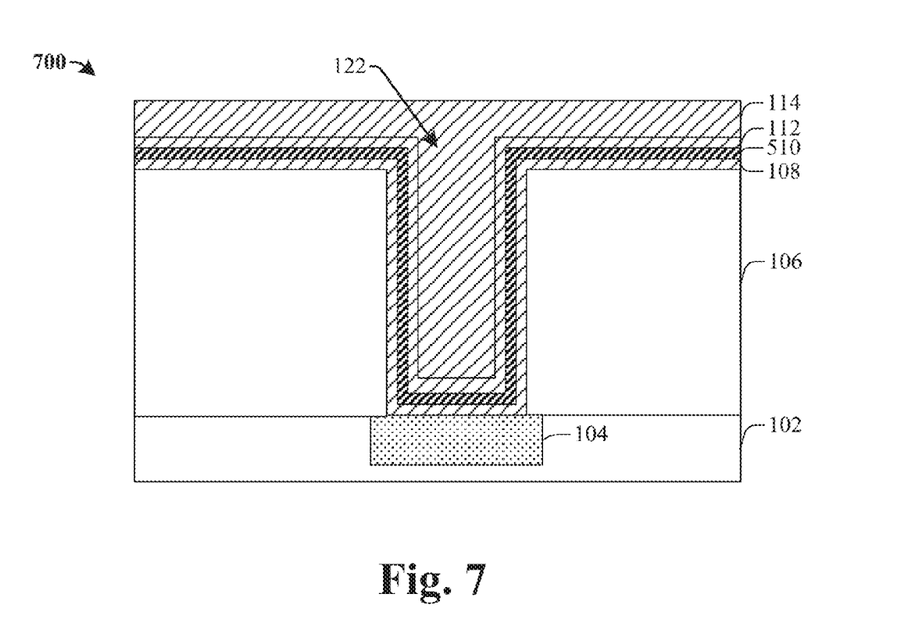

FIG. 7 illustrates some embodiments of a cross-sectional view 700 corresponding to action 222.

As illustrated by cross-sectional view 700, a bulk cobalt layer 114 is formed to fill a remaining spacer of the opening 122. In some embodiments, the bulk cobalt layer 114 is formed by a plating process. In various embodiments, the plating process may comprise an electro-chemical plating process or an electro-less plating process. In some embodiments, a chemical solution used to remove a passivation film formed on the cobalt seed layer 112 is also used as a bath solution for the plating process. In various embodiments, the bath solution can be an acid bath, a base bath, or a neutral bath. In some other embodiments, the bulk cobalt layer 114 is deposited by a PVD process or a CVD process and can be performed in-situ with the first cobalt liner 108 and the cobalt nitride liner 510. For this approach, the illustrated same orboundary line between the cobalt seed liner 112 and the bulk cobalt layer 114 may not exist.

Figure 8:
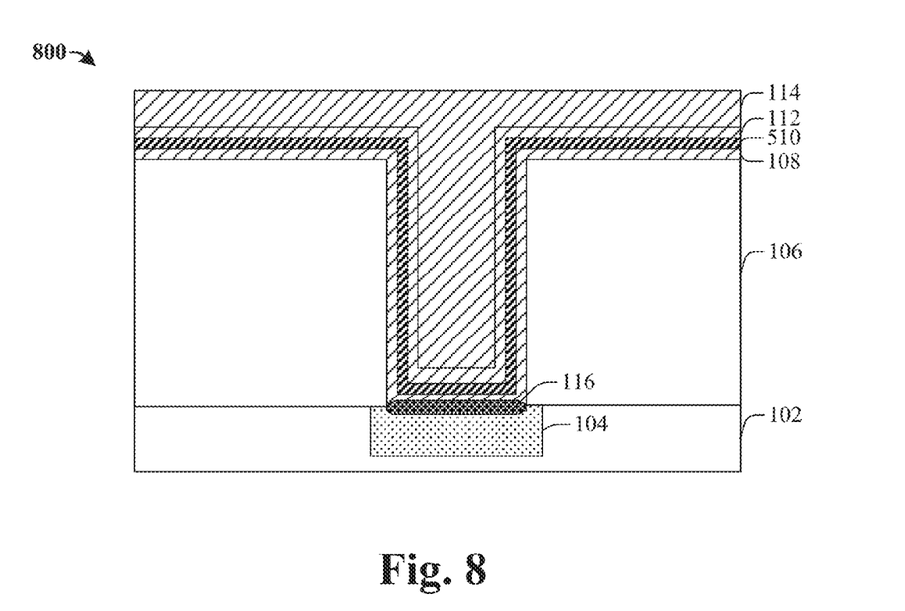

FIG. 8 illustrates some embodiments of a cross-sectional view 800 corresponding to action 224.

As illustrated by cross-sectional view 800, an annealing process is performed after filling the remaining space of the opening with the bulk cobalt layer 114. The annealing process causes the first cobalt liner 108 to react with an underlying semiconductor structure 104 to form a silicide film 116 at an interface of the first cobalt liner 108 and the underlying semiconductor structure 104. In some embodiments, a lower lateral portion of the first cobalt liner 108 is thinned because of reaction consumption (also as shown in FIG. 1A) while in some embodiments; the silicide film 116 is formed to abut the cobalt nitride liner 510 (as shown in FIG. 1B). In some embodiments, a planarization process is performed after annealing. The planarization process removes excessive portions of the first cobalt liner 108, the cobalt nitride liner 510, and the bulk cobalt layer 114, to form a planar surface. As a result, the first cobalt liner 108, the cobalt nitride liner 510, and the bulk cobalt layer 114 may have planar upper surfaces aligned with an upper surface of the dielectric layer 106 as shown in FIG. 1A and FIG. 1B. In some embodiments, the planarization process may comprise a chemical mechanical polishing (CMP) process. In other embodiments, the planarization process may comprise other etching processes.

Figure 9:
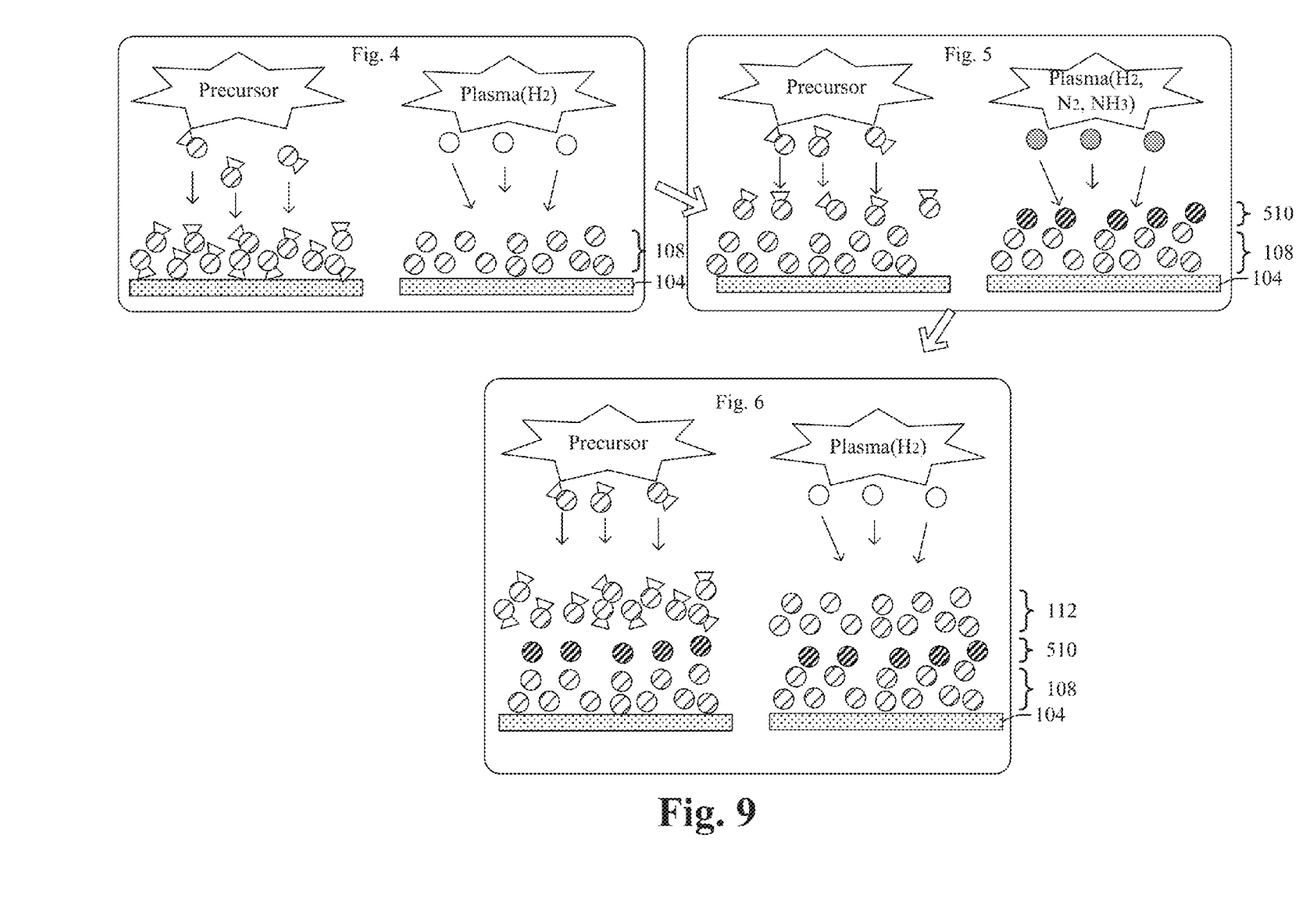
FIG. 9 shows a processing system for depositing interconnects in accordance with some embodiments.

FIG. 9 shows a processing system for depositing interconnects corresponding to FIGS. 4-6 in accordance with some embodiments. In some embodiments, the first cobalt liner 108, cobalt nitride liner 510, and cobalt seed liner 112 are formed in situ as shown in FIG. 9. Corresponding to FIG. 4, a cobalt precursor is deposited on surfaces of the semiconductor structure 104. In some embodiments, the cobalt precursor may comprise dicobalt hexcarbonyl tertbutylacctylene (CCTBA). The cobalt precursor is treated by plasma. In some embodiments, the treating plasma contains hydrogen. Precursor deposition and plasma treatment can be repeated for several cycles (e.g. 2-3 cycles) to achieve desired thickness of the first cobalt liner 108. Still in the same vacuum chamber and still under continuous vacuum, corresponding to FIG. 5, a barrier precursor is deposited on surfaces of the first cobalt liner 108. In some embodiments, the barrier precursor may comprise dicobalt hexcarbonyl tertbutylacctylene (CCTBA) or cobalt tricarbonyl nitrosyl (Co(CO)$_3$NO). The barrier precursor is treated by plasma. In some embodiments, the treating plasma contains hydrogen, nitrogen, or ammonia. Precursor deposition and plasma treatment can be repeated for several cycles (e.g. 5-6 cycles) to achieve desired thickness of the cobalt nitride liner 510. Still in the same vacuum chamber and still under continuous vacuum, corresponding to FIG. 6, a seed layer precursor is deposited on surfaces of the cobalt nitride liner 510. In some embodiments, the seed layer precursor may comprise dicobalt hexcarbonyl tertbutylacctylene (CCTBA). The barrier precursor is treated by plasma. In some embodiments, the treating plasma contains hydrogen. Precursor deposition and plasma treatment can be repeated for several cycles (e.g. 8-9 cycles) to achieve desired thickness of the cobalt seed liner 112.

Thus, the present disclosure relates to optimized techniques to form interconnect layers (especially MEOL interconnects with silicide film) that reduce voids and improve reliability. A first cobalt liner (acting as a metal silicide liner), a cobalt nitride liner (acting as a barrier liner) and a cobalt seed liner can be formed in-situ using a low temperature chemical vapor deposition (CVD) process followed by an annealing process for silicidation. Thus, better filling can be achieved.

In some embodiments, the present disclosure relates to a method of manufacturing an integrated circuit device. The method comprises forming a dielectric layer over a substrate. The dielectric layer comprises an opening arranged within the dielectric layer. The method further comprises forming a first cobalt liner along bottom and sidewall surfaces of the opening. The method further comprises forming a barrier liner on exposed surfaces of the first cobalt liner and filling a remaining space of the opening with a bulk cobalt layer.

In other embodiments, the present disclosure relates to a method of manufacturing an integrated circuit device. The method comprises forming a middle-of-the-line (MEOL) structure over a substrate and forming a dielectric layer over the substrate. The method further comprises. The method further comprises forming an opening extending through the dielectric layer to expose at least a portion of an upper surface of the MEOL structure and forming a first cobalt liner on the exposed portion of the upper surface of the silicon layer and extending upwardly along sidewalls of the opening. The method further comprises forming a cobalt nitride liner on exposed surfaces of the first cobalt liner and filling a remaining space of the opening with a bulk cobalt layer. The method further comprises performing an annealing process after filling the bulk cobalt layer to form a silicide film at an interface of the first cobalt liner and the exposed portion of the upper surface of the MEOL structure In yet other embodiments, the present disclosure relates to an integrated circuit device. The integrated circuit device comprises a semiconductor substrate and a dielectric layer disposed over the semiconductor substrate and having an opening arranged within the dielectric layer. The integrated circuit device further comprises a first cobalt liner disposed along sidewall surfaces of the opening and a barrier liner covering the first cobalt liner. The integrated circuit device further comprises a cobalt plug filling a remaining space of the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated circuit device, comprising:
   forming a dielectric layer over a substrate, wherein the dielectric layer comprises an opening arranged within the dielectric layer;
   forming a first cobalt liner along bottom and sidewall surfaces of the opening;
   forming a barrier liner on exposed surfaces of the first cobalt liner;
   forming a bulk cobalt layer in the opening and over the barrier liner to fill a remaining space of the opening; and
   performing an annealing process after forming the bulk cobalt layer, wherein the annealing process causes the first cobalt liner to react with an underlying middle-of-the-line (MEOL) structure to form a silicide film at an interface of the first cobalt liner and the underlying MEOL structure.

2. The method of claim 1, wherein the first cobalt liner is formed in direct contact with the dielectric layer.

3. The method of claim 1, wherein the first cobalt liner is formed using a sputtering deposition process.

4. The method of claim 1, wherein the first cobalt liner is formed using a chemical vapor deposition (CVD) process.

5. The method of claim 1, wherein the bulk cobalt layer is formed using a physical vapor deposition (PVD) process.

6. The method of claim 1, wherein the first cobalt liner, the barrier liner and the bulk cobalt layer are formed in succession in a chamber which is held continuously under vacuum while the first cobalt liner, barrier liner, and bulk cobalt layer are formed.

7. The method of claim 1, further comprising:
   forming a cobalt seed liner onto the barrier liner prior to filling the bulk cobalt layer;
   wherein the bulk cobalt layer is filled by a plating process.

8. The method of claim 7, wherein the cobalt seed liner and the barrier liner are formed in a chamber which is held continuously under vacuum while the cobalt seed liner and the barrier liner are formed.

9. The method of claim 1, wherein forming the first cobalt liner and the barrier liner comprises:
   introducing dicobalt hexcarbonyl tertbutylacctylene (CCTBA) into a chamber as a cobalt precursor;
   exposing the cobalt precursor to a plasma comprising hydrogen to form the first cobalt liner;
   introducing dicobalt hexcarbonyl tertbutylacctylene (CCTBA) onto the first cobalt liner in the chamber as a barrier precursor; and
   exposing the barrier precursor to a plasma comprising hydrogen, nitrogen, or ammonia to form a cobalt nitride liner.

10. The method of claim 1, wherein the first cobalt liner is formed using dicobalt hexcarbonyl tertbutylacctylene (CCTBA) as a precursor and the barrier liner is formed using cobalt tricarbonyl nitrosyl ($Co(CO)_3NO$) as a precursor.

11. A method of manufacturing an integrated circuit device, comprising:
   forming a middle-of-the-line (MEOL) structure over a substrate;
   forming a dielectric layer over the substrate;
   forming an opening extending through the dielectric layer to expose at least a portion of an upper surface of the MEOL structure;
   forming a first cobalt liner on the exposed portion of the upper surface of the MEOL structure extending upwardly along sidewalls of the opening;
   forming a cobalt nitride liner on exposed surfaces of the first cobalt liner;
   filling a remaining space of the opening with a bulk cobalt layer; and
   performing an annealing process after filling the bulk cobalt layer to form a silicide film at an interface of the first cobalt liner and the exposed portion of the upper surface of the MEOL structure.

12. The method of claim 11, wherein the first cobalt liner is formed in direct contact with the dielectric layer.

13. The method of claim 11, wherein the first cobalt liner and the cobalt nitride liner are formed in succession in a chamber which is held continuously under vacuum while the first cobalt liner and cobalt nitride liner are formed.

14. The method of claim 11, wherein the first cobalt liner, the cobalt nitride liner and the bulk cobalt layer are formed below 200° C.

15. The method of claim 11, wherein the bulk cobalt layer is formed using a chemical vapor deposition (CVD) process or a physical vapor deposition process (PVD).

16. An integrated circuit device, comprising:
   a substrate;
   a dielectric layer disposed over the substrate and having an opening vertically extending through the dielectric layer;
   a first cobalt liner disposed along sidewall and bottom surfaces of the opening;
   a cobalt nitride barrier liner disposed along the first cobalt liner; and
   a bulk cobalt layer disposed over the cobalt nitride barrier liner and filling a remaining space of the opening;
   wherein the substrate includes a silicon region directly under the opening;
   wherein the integrated circuit device further comprises a silicide layer comprising cobalt atoms disposed at an interface of the silicon region and the first cobalt liner.

17. The integrated circuit device of claim 16, further comprising:
   a middle-of-the-line (MEOL) structure disposed over the substrate directly under the opening; and
   a cobalt silicide layer comprising cobalt atoms disposed at an interface of the MEOL structure and the first cobalt liner, wherein the first cobalt liner contacts sidewalls of the cobalt silicide layer.

18. The integrated circuit device of claim 17, wherein the cobalt silicide layer vertically extends from a bottom surface of the cobalt nitride barrier liner to below a bottom surface of the first cobalt liner.

19. The integrated circuit device of claim 16, wherein a cobalt silicide layer is disposed on a concave upper surface of the substrate and is separated from the cobalt nitride barrier liner by the first cobalt liner.

* * * * *